United States Patent
Seo et al.

(10) Patent No.: US 9,691,459 B2
(45) Date of Patent: Jun. 27, 2017

(54) SEMICONDUCTOR MEMORY DEVICE INCLUDING SHORTED VARIABLE RESISTOR ELEMENT OF MEMORY CELL

(71) Applicants: Bo-young Seo, Suwon-si (KR); Suk-soo Pyo, Hwaseong-si (KR); Gwan-hyeob Koh, Seoul (KR); Yong-kyu Lee, Gwacheon-si (KR); Dae-shik Kim, Hwaseong-si (KR)

(72) Inventors: Bo-young Seo, Suwon-si (KR); Suk-soo Pyo, Hwaseong-si (KR); Gwan-hyeob Koh, Seoul (KR); Yong-kyu Lee, Gwacheon-si (KR); Dae-shik Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/249,845

(22) Filed: Aug. 29, 2016

(65) Prior Publication Data

US 2017/0062032 A1    Mar. 2, 2017

(30) Foreign Application Priority Data

Sep. 2, 2015    (KR) .......... 10-2015-0124230

(51) Int. Cl.
    *G11C 11/16*    (2006.01)
(52) U.S. Cl.
    CPC ........ *G11C 11/161* (2013.01); *G11C 11/1673* (2013.01)
(58) Field of Classification Search
    CPC ..................................... G11C 11/16

USPC ........................................... 365/148
See application file for complete search history.

(56) References Cited

U.S. PATENT DOCUMENTS

| 8,508,987 | B2 | 8/2013 | Tsuji et al. | |
|---|---|---|---|---|
| 8,830,737 | B2 | 9/2014 | Keshtbod et al. | |
| 8,902,641 | B2 | 12/2014 | Chih et al. | |
| 8,917,562 | B2 | 12/2014 | Wang et al. | |
| 8,976,613 | B2 | 3/2015 | Romanovskyy | |
| 9,025,367 | B1 | 5/2015 | Lin | |
| 2005/0157541 | A1* | 7/2005 | Iwata | G11C 11/16 365/158 |
| 2006/0092689 | A1* | 5/2006 | Braun | G11C 7/067 365/158 |
| 2009/0201717 | A1* | 8/2009 | Maeda | G11C 11/16 365/148 |
| 2013/0148406 | A1* | 6/2013 | Shimakawa | G11C 11/1673 365/148 |

(Continued)

*Primary Examiner* — Min Huang
(74) *Attorney, Agent, or Firm* — Myers Bigel, P.A.

(57) ABSTRACT

A semiconductor memory device includes a shorted variable resistor element in a memory cell. The semiconductor memory device includes main cells and reference cells each including a cell transistor and a variable resistor element. The variable resistor element of the reference cell is shorted by applying a breakdown voltage of a magnetic tunnel junction (MTJ) element, connection in parallel to a conductive via element, connection to a reference bit line at a node between the cell transistor and the variable resistor element, or replacement of the variable resistor element with the conductive via element. A sense amplifier increases a sensing margin of the main cell by detecting and amplifying a current flowing in a bit line of the main cell and a current flowing in the reference bit line to which a reference resistor is connected.

20 Claims, 25 Drawing Sheets

(56) References Cited

U.S. PATENT DOCUMENTS

| | | |
|---|---|---|
| 2014/0056059 A1 | 2/2014 | Mueller et al. |
| 2014/0063923 A1 | 3/2014 | Jefremow et al. |
| 2014/0185361 A1* | 7/2014 | Oh .................. G11C 13/004 |
| | | 365/148 |
| 2015/0092469 A1 | 4/2015 | Kim et al. |
| 2016/0093354 A1* | 3/2016 | Andre ............... G11C 11/1673 |
| | | 714/819 |
| 2016/0260481 A1* | 9/2016 | Miura ............... G11C 13/0033 |

* cited by examiner (a)

(b)

(a)

(b)

(a)

(b)

(a)

(b)

SEMICONDUCTOR MEMORY DEVICE INCLUDING SHORTED VARIABLE RESISTOR ELEMENT OF MEMORY CELL

CROSS-REFERENCE TO RELATED APPLICATION

This application claims the benefit of and priority from Korean Patent Application No. 10-2015-0124230, filed on Sep. 2, 2015, in the Korean Intellectual Property Office, the disclosure of which is incorporated herein in its entirety by reference.

BACKGROUND

The inventive concepts relate to semiconductor devices, and more particularly, to semiconductor memory devices.

Since magnetoresistive random-access memories (MRAMs) among resistive memory devices may perform write operations and read operations at high speed, are nonvolatile, and have relatively low power consumption, MRAMs may be used in data storage devices. An MRAM can store data in a variable resistor element, which may be a magnetoresistor element of a memory cell. The MRAM can identify data of a main cell based on a variable resistor element of the main cell and a variable resistor element of a reference cell. As a variable resistance value of a reference cell may be changed due to a continuous read operation, a variable resistance dispersion may be caused in the reference cell, and a data sensing margin of a main cell may be reduced.

SUMMARY

Embodiments of the inventive concepts provide a semiconductor memory device that can increase a sensing margin of main cells by shorting a variable resistor element of a reference cell in a memory cell array and providing a reference resistor.

According to some embodiments of the inventive concepts, a semiconductor memory device includes a main memory cell array, a reference memory cell array, and a reference resistor circuit. The main memory cell array includes first resistive memory cells respectively comprising a first cell transistor and a first variable resistor element connected between the first cell transistor and a first bit line. The reference memory cell array includes second resistive memory cells respectively comprising a second cell transistor and a second variable resistor element connected between the second cell transistor and a second bit line. The second variable resistor element includes an electrical short. The reference resistor circuit includes at least one reference resistor coupled to the second bit line.

In some embodiments, the semiconductor memory device may further include a sense amplifier coupled to the first and second bit lines and configured to detect and amplify respective currents flowing therein.

In some embodiments, a resistance value of the at least one reference resistor coupled to the second bit line may be between resistance values corresponding to first and second logic states of the first variable resistor element.

In some embodiments, the resistance value of the at least one reference resistor may have a narrower range than the resistance values corresponding to first and second logic states of the first variable resistor element.

In some embodiments, the at least one reference resistor may have a fixed resistance.

In some embodiments, the at least one reference resistor may be a plurality of resistors having respective fixed resistance values. The reference resistor circuit may include a plurality of transistors, which may be connected in parallel to the resistors, respectively. The transistors may be configured to selectively short the resistors in response to respective trimming signals to provide the resistance value that is between the resistance values corresponding to the first and second logic states of the first variable resistor element.

In some embodiments, the second variable resistor element may be a magnetic tunnel junction (MTJ) element having a breakdown voltage associated therewith, and the electrical short may be provided by the MTJ element responsive to application of a voltage greater than the breakdown voltage thereto.

In some embodiments, the electrical short may be provided by a conductive via element that extends through a via hole and is electrically connected in parallel with the second variable resistor element.

In some embodiments, the electrical short may be provided by a connection of the second bit line to a connection node between the second cell transistor and the second variable resistor element.

In some embodiments, the second variable resistor element may be a conductive via element that extends through a via hole to provide the electrical short.

According to some aspects of the inventive concepts, there is provided a semiconductor memory device including: a first memory cell including a first cell transistor and a first variable resistor element connected to the first cell transistor, a second memory cell including a second cell transistor and a second variable resistor element connected to the second cell transistor, and a sense amplifier configured to detect and amplify a current flowing in a first bit line connected to the first memory cell and a current flowing in a second bit line connected to the second memory cell, wherein the semiconductor memory device comprises a reference resistor connectable to the second bit line, and when the second variable resistor element is shorted, the reference resistor is connected to the second bit line instead of the shorted second variable resistor element.

The second variable resistor element may include a magnetic tunnel junction (MTJ) element, wherein the MTJ element is shorted based on a breakdown voltage.

The second variable resistor element may be connected in parallel with a filled via hole comprising a conductive material.

The second bit line may be connected to a connection node between the second cell transistor and the second variable resistor element.

The second variable resistor element may be a filled via hole comprising a conductive material.

The reference resistor may be set to an intermediate resistance value between resistance values corresponding to a first data logic and a second data logic stored in the first variable resistor element.

According to some aspects of the inventive concepts, there is provided a semiconductor memory device including: a plurality of resistive memory cells arranged in rows and columns, each of the plurality of resistive memory cells comprising a cell transistor and a variable resistor element; a first memory cell array including a first cell transistor connected to each of a plurality of word lines respectively corresponding to the rows and a first variable resistor element connected to each of a plurality of first bit lines respectively corresponding to the columns; a second memory cell array including a second cell transistor connected to each of the plurality of word lines and a second variable resistor element connected to a second bit line corresponding to one of the columns, wherein the second variable resistor element is shorted; and a reference resistor connected to the second bit line.

The reference resistor may be included in a reference resistor control circuit, wherein the reference resistor control circuit includes: a plurality of resistors; and transistors respectively connected in parallel to the plurality of resistors, wherein the transistors selectively short the plurality of resistors in response to trimming signals.

The trimming signals may be applied during a process of testing the semiconductor memory device.

The resistive memory cells may include at least one of spin-transfer torque-magnetoresistive random-access memory (STT-MRAM) cells, magnetoresistive random-access memory (MRAM) cells, phase change random-access memory (PRAM) cells, and resistive random-access memory (ReRAM) cells.

According to some aspects of the inventive concepts, there is provided a semiconductor memory device including: a plurality of resistive memory cells arranged in rows and columns, each of the plurality of resistive memory cells comprising a cell transistor and a variable resistor element; a first memory cell array including a first cell transistor connected to each of a plurality of word lines respectively corresponding to the rows and a first variable resistor element connected to each of a plurality of first bit lines respectively corresponding to the columns; a second memory cell array including a second cell transistor connected to each of the plurality of word lines and a second variable resistor element connected to a second bit line corresponding to one of the columns, wherein the second bit line is connected to a connection node between the second cell transistor and the second variable resistor element; and a reference resistor connected to the second bit line.

The connection node may be a pad electrode connected to a drain of the second cell transistor and the second variable resistor element.

The reference resistor may be set to an intermediate resistance value between resistance values corresponding to a first data logic and a second data logic stored in the first variable resistor element.

According to some aspects of the inventive concepts, there is provided a semiconductor memory device including: a plurality of resistive memory cells arranged in rows and columns, each of the plurality of resistive memory cells comprising a cell transistor and a variable resistor element; a first memory cell array including a first cell transistor connected to each of a plurality of word lines respectively corresponding to the rows and a first variable resistor element connected to each of a plurality of first bit lines respectively corresponding to the columns; a second memory cell array including a second cell transistor connected to each of the plurality of word lines and a via hole connected to a second bit line corresponding to one of the columns, wherein the via hole connects the second cell transistor and the second bit line; and a reference resistor connected to the second bit line.

The semiconductor memory device may further include a dummy memory cell array disposed between the first memory cell array and the second memory cell array.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
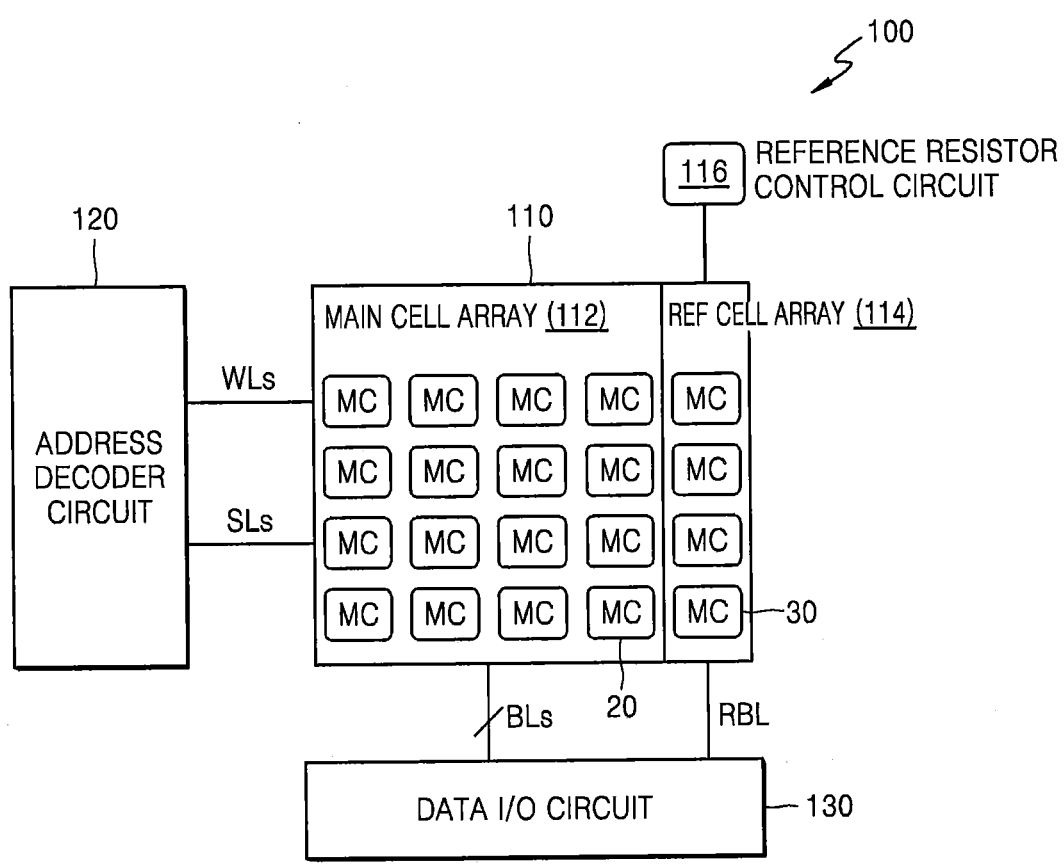
FIG. 1 is a block diagram of a memory device including a shorted variable resistor element of a memory cell according to example embodiments.

The advantages and features of the inventive concepts and methods of achieving the advantages and features will be described more fully with reference to the accompanying drawings, in which example embodiments of the inventive concepts are shown.

The inventive concepts may, however, be embodied in many different forms and should not be construed as being limited to the embodiments set forth herein; rather these embodiments are provided so that this disclosure will be thorough and complete, and will fully convey the inventive concepts to one of ordinary skill in the art. It should be understood, however, that there is no intent to limit example embodiments of the inventive concepts to the particular forms disclosed, but conversely, example embodiments of the inventive concepts are to cover all modifications, equivalents, and alternatives falling within the spirit and scope of the inventive concepts. Like reference numerals denote like elements in the drawings. In the attached drawings, sizes of structures may be exaggerated for clarity.

The terminology used herein is for the purpose of describing example embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, components, or combinations thereof, but do not preclude the presence or addition of one or more other features, integers, steps, operations, elements, components, or combinations thereof.

It will be understood that when an element is referred to as being "coupled," "connected," or "responsive" to another element, it can be directly coupled, connected, or responsive to the other element, or intervening elements may also be present. In contrast, when an element is referred to as being "directly coupled," "directly connected," or "directly responsive" to another element, there are no intervening elements present. As used herein, the term "and/or" includes any and all combinations of one or more of the associated listed items.

Spatially relative terms, such as "above," "below," "upper," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly. Well-known functions or constructions may not be described in detail for brevity and/or clarity.

It will be understood that, although the terms "first," "second," etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of" when preceding a list of elements, modify the entire list of elements and do not modify the individual elements of the list.

FIG. 1 is a block diagram of a memory device 100 including a shorted variable resistor element of a memory cell according to example embodiments.

Referring to FIG. 1, the memory device 100 includes a memory cell array 110, a reference resistor control circuit 116, an address decoder circuit 120, and a data input/output (I/O) circuit 130.

The memory cell array 110 includes a plurality of memory cells arranged in rows and columns. The plurality of memory cells may include resistive memory cells including a variable resistor element having a variable resistance. For example, when the variable resistor element is formed of a phase-change material (e.g., Ge—Sb—Te (GST)) and has a resistance that varies according to a temperature, the memory device 100 may be a phase change random-access memory (PRAM). Alternatively, when the variable resistor element includes an upper electrode, a lower electrode, and a complex metal oxide disposed between the upper electrode and the lower electrode, the memory device 100 may be a resistive random-access memory (ReRAM). Alternatively, when the variable resistor element includes an upper electrode formed of a magnetic material, a lower electrode formed of a magnetic material, and a dielectric material disposed between the upper electrode and the lower electrode, the memory device 100 may be a magnetoresistive random-access memory (MRAM).

When the memory device 100 is an MRAM, each of the memory cells may include a cell transistor and a variable resistor element including a magnetic tunnel junction (MTJ). The memory cell array 110 includes a plurality of word lines WLs connected to the memory cells, a plurality of bit lines BLs and a reference bit line RBL, and a plurality of source lines SLs. Each of the word lines WLs is connected to gates of cell transistors of the memory cells included in one of the rows, and each of the bit lines BLs and the source lines SLs is connected to variable resistor elements and sources of cell transistors of the memory cells included in one of the columns.

The memory cell array 110 includes a main cell array 112 and a reference cell array 114. The main cell array 112 includes a plurality of main cells 20, and each of the main cells 20 includes a first cell transistor and a first variable resistor element. The main cell array 112 includes first cell transistors respectively connected to the plurality of word lines WLs respectively corresponding to the rows and first variable resistor elements respectively connected to the plurality of bit lines BLs respectively corresponding to the columns.

The reference cell array 114 includes a plurality of reference cells 30, and each of the reference cells 30 includes a second cell transistor and a second variable resistor element. The reference cell 30 may have the same structure as that of the main cell 20. The reference cell array 114 includes second cell transistors respectively connected to the plurality of word lines WLs and second variable resistor elements connected to the reference bit line RBL corresponding to one of the columns, and the second variable resistor elements may be shorted.

According to an example embodiment, the second variable resistor element of the reference cell 30 may be shorted by using an insulating layer breakdown voltage. According to another example embodiment, a drain of the second cell transistor in the reference cell 30 may be connected to the reference bit line RBL without using the second variable resistor element. According to another example embodiment, the second variable resistor element may be connected in parallel to a via hole in which a conductive material is filled. According to another example embodiment, the second variable resistor element may be replaced with the via hole in which the conductive material is filled.

The reference resistor control circuit 116 is connected to the reference bit line RBL, and generates a resistance of a desired value (referred to herein as a reference resistor) in response to trimming signals, and provides the reference resistor to the reference bit line RBL. The reference resistor is provided to a sense amplifier circuit of the data I/O circuit 130 along with the reference cell 30 selected in the reference ell array 114, and is used to identify data stored in the main cell 20.

An address decoder circuit 120 may be connected to the memory cell array 110 through the word lines WLs and the source lines SLs. The address decoder circuit 120 may decode row addresses in order to select the word lines WLs and the source lines SLs and may decode column addresses in order to select the bit lines BLs.

The data I/O circuit 130 may be connected to the memory cell array 110 through the bit lines BLs. The data I/O circuit 130 may include a column selection circuit, a write driver circuit, and the sense amplifier circuit. The column selection circuit selects one from among the bit lines BLs in response to a column selection signal applied by the address decoder circuit 120, and a predetermined read/write voltage is applied to the bit line BL selected by the column selection circuit through the write driver circuit during a read/write operation.

The sense amplifier circuit identifies data read from the main cell 20 of the main cell array 112. The sense amplifier circuit identifies data of the main cell by detecting and amplifying a current flowing in the bit line BL of the main cell 20 and a current flowing in the reference bit line RBL of the reference cell 30.

Figure 2:
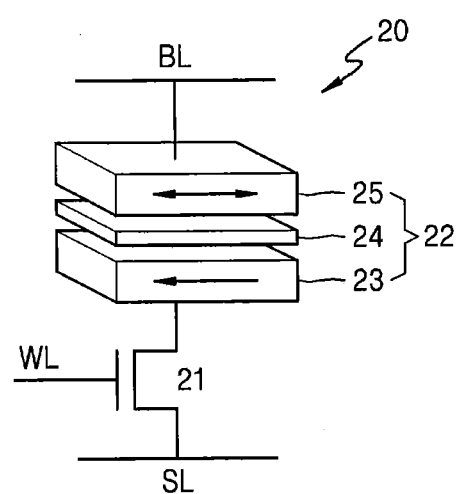
FIG. 2 is a view illustrating a configuration of a memory cell included in a memory cell array of FIG. 1.

FIG. 2 is a view illustrating a configuration of a memory cell included in the memory cell array 110 of FIG. 1.

FIG. 2 illustrates the main cell 20 among memory cells MCs included in the memory cell array 110. The main cell 20 includes a cell transistor 21 and an MTJ structure 22. A gate of the cell transistor 21 may be connected to the word line WL, and one electrode, for example, a drain electrode, of the cell transistor 21 may be connected to the bit line BL through the MTJ structure 22. The other electrode, for example, a source electrode, of the cell transistor 21 may be connected to the source line SL.

The MTJ structure 22 may include a pinned layer 23, a free layer 25, and a tunnel or barrier layer 24 disposed between the pinned layer 23 and the free layer 25. A magnetization direction of the pinned layer 23 may be fixed, and a magnetization direction of the free layer 25 may be parallel (P) or anti-parallel (AP) relative or with respect to a magnetization direction of the pinned layer 23 according to stored data during a write operation. In order to fix a magnetization direction of the pinned layer 23, for example, an anti-ferromagnetic layer may be further provided.

When the free layer 25 and the pinned layer 23 of the MTJ structure 22 are in a parallel (P) state, that is, when the MTJ structure 22 has a low resistance, the main cell 20 is defined as being in a data '0' logic state. In contrast, when the free layer 25 and the pinned layer 23 of the MTJ structure 22 are in an anti-parallel (AP) state, that is, when the MTJ structure 22 has a high resistance, the main cell 20 is defined as being in a data '1' logic state.

According to an example embodiment, the main cell 20 may be defined as being in the data '0' logic state when the MTJ structure 22 is in the AP state and may be defined as being in the data '1' logic state when the MTJ structure 22 is in the P state.

Figure 3A:
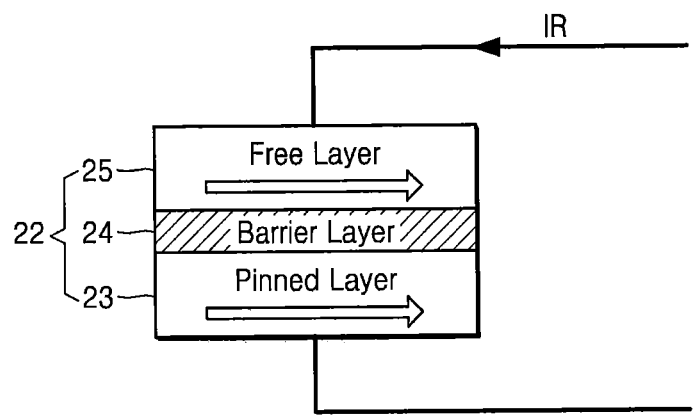
FIGS. 3A and 3B are conceptual views illustrating data stored according to a magnetization direction in a magnetic tunnel junction (MTJ) structure of the memory cell of FIG. 2.
Figure 3B:
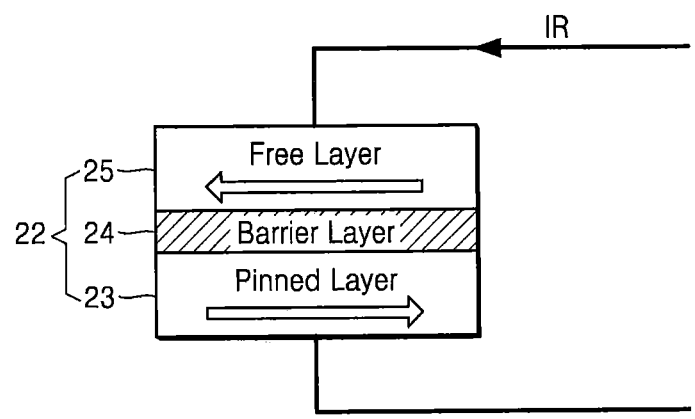

FIGS. 3A and 3B are conceptual views illustrating data stored according to a magnetization direction in the MTJ structure 22 of the memory cell of FIG. 2.

Referring to FIGS. 3A and 3B, a resistance value of the MTJ structure 22 may vary according to a magnetization direction of the free layer 25. When a read current IR flows in the MTJ structure 22, a data voltage according to a resistance value of the MTJ structure 22 may be output. Since an intensity of the read current IR is much less than an intensity of a write current, a magnetization direction of the free layer 25 is not changed due to the read current IR.

As shown in FIG. 3A, a magnetization direction of the free layer 25 and a magnetization direction of the pinned layer 23 of the MTJ structure 22 may be parallel to each other. The MTJ structure 22 in this case may have a low resistance value and data '0' may be output during a read operation.

As shown in FIG. 3B, a magnetization direction of the free layer 25 and a magnetization direction of the pinned layer 23 of the MTJ structure 22 may be anti-parallel to each other. The MTJ structure 22 in this case may have a high resistance value and data '1' may be output during a read operation.

Figure 6:
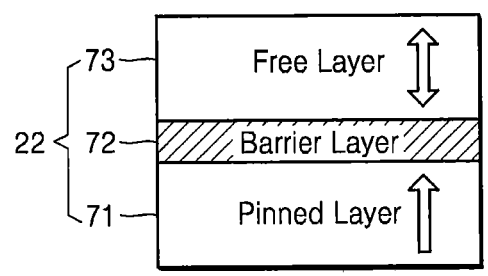

In the MTJ structure 22 of the present example embodiment, the free layer 25 and the pinned layer 23 are formed to have a horizontal magnetic element structure for convenience. However, in the MTJ structure 22, the free layer 25 and the pinned layer 23 may be formed to have a vertical magnetic element structure as shown in FIG. 6.

Figure 4:
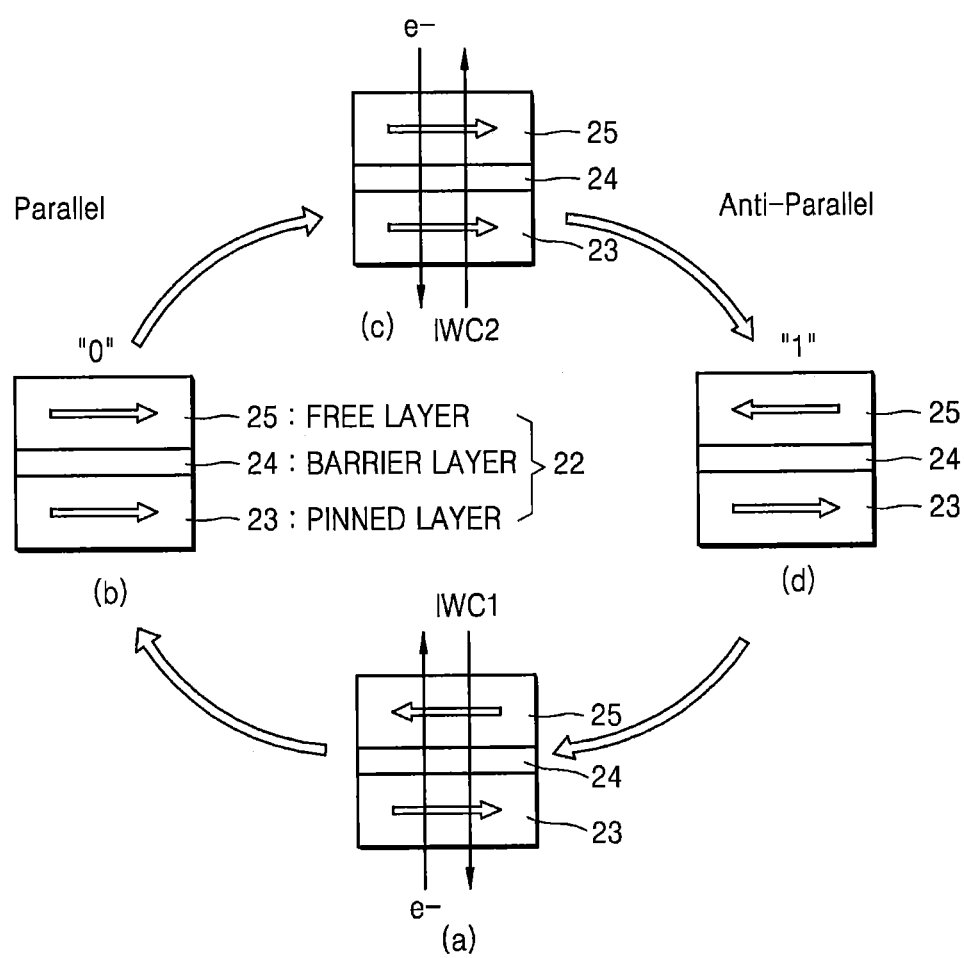
FIG. 4 is a conceptual view illustrating a write operation in the MTJ structure of FIG. 2.

FIG. 4 is a conceptual view illustrating a write operation in the MTJ structure 22 of FIG. 2.

Referring to FIG. 4, a magnetization direction of the free layer 25 may be determined according to a direction of a write current IW that flows in the MTJ structure 22. For example, as shown in (a), when a first write current IWC1 is applied from the free layer 25 to the pinned layer 23, free electrons having a spin orientation that is the same as that of the pinned layer 23 apply a torque to the free layer 25. As a result, the free layer 25 may be magnetized parallel to the pinned layer 23. Accordingly, the MTJ structure 22 may have a low resistance value and data '0' may be stored as shown in (b).

In the MTJ structure 22 that is in a data '0' logic state, when a second write current IWC2 is applied from the pinned layer 23 to the free layer 25 as shown in (c), electrons having a spin orientation that is the opposite to that of the pinned layer 23 return to the free layer 25 and apply a torque. As a result, the free layer 25 may be magnetized anti-parallel to the pinned layer 23. Accordingly, the MTJ structure 22 may have a high resistance value and data '1' may be stored as shown in (d).

In the MTJ structure 22, a magnetization direction of the free layer 25 may be changed to be parallel or anti-parallel to the pinned layer 23 due to a spin-transfer torque (STT), and thus data '0' or '1' may be stored.

FIGS. 5A through 7B are conceptual views illustrating modifications of the MTJ structure 22 of FIG. 2.

Figure 5A:
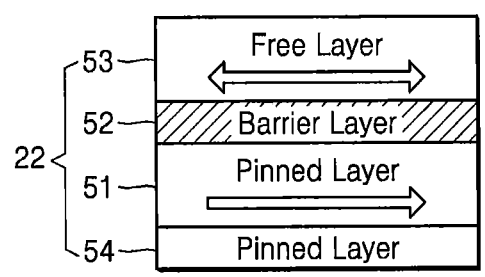
FIGS. 5A through 7B are conceptual views illustrating modifications of the MTJ structure of FIG. 2.

Referring to FIG. 5A, the MTJ structure 22 may include a pinned layer 51, a tunnel or barrier layer 52, a free layer 53, and an anti-ferromagnetic layer 54. The free layer 53 may include a material having a variable magnetization direction. A magnetization direction of the free layer 53 may be changed due to electrical/magnetic factors inside and/or outside a memory cell. The free layer 53 may include a ferromagnetic material including at least one of cobalt (Co), iron (Fe), and nickel (Ni). For example, the free layer 53 may include at least one selected from the group consisting of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The tunnel or barrier layer 52 may have a thickness that is less than a spin diffusion distance. The tunnel or barrier layer 52 may include a nonmagnetic material. For example, the tunnel or barrier layer 52 may include at least one selected from the group consisting of magnesium (Mg) oxide, titanium (Ti) oxide, aluminum (Al) oxide, magnesium-zinc (MgZn) oxide, and magnesium-boron oxide, titanium (Ti) nitride, and vanadium (V) nitride.

The pinned layer 51 may have a magnetization direction fixed by the anti-ferromagnetic layer 54. The pinned layer 51 may include a ferromagnetic material. For example, the pinned layer 51 may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The anti-ferromagnetic layer 54 may include an anti-ferromagnetic material. For example, the anti-ferromagnetic layer 54 may include at least one selected from the group consisting of PtMn, IrMn, MnO, MnS, MnTe, $MnF_2$, $FeCl_2$, FeO, $CoCl_2$, CoO, $NiCl_2$, NiO, and Cr.

Since each of the free layer 53 and the pinned layer 51 of the MTJ structure 22 is formed of a ferromagnetic material, a stray field may be formed at an edge of the ferromagnetic material. The stray field may reduce magnetoresistance or may increase a resistance magnetism of the free layer 53. In addition, the stray field may affect switching characteristics and thus may lead to asymmetric switching. Accordingly, a structure for reducing or controlling a stray field formed in a ferromagnetic material in the MTJ structure 22 may be used.

Figure 5B:
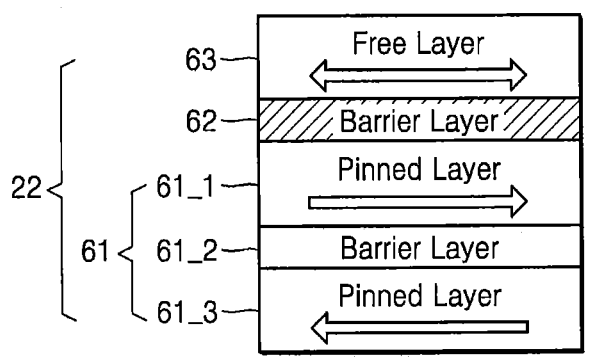

Referring to FIG. 5B, the MTJ structure 22 may include a pinned layer 61, a tunnel or barrier layer 62, and a free layer 63. The pinned layer 61 may be formed of a synthetic anti-ferromagnetic (SAF) material. The pinned layer 61 may include a first ferromagnetic layer 61_1, a coupling layer 61_2, and a second ferromagnetic layer 61_3. Each of the first and second ferromagnetic layers 61_1 and 61_3 may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. A magnetization direction of the first ferromagnetic layer 61_1 and a magnetization direction of the second ferromagnetic layer 61_3 may be different from each other, and each magnetization direction may be fixed. The coupling layer 61_2 may include ruthenium (Ru).

Referring to FIG. 6, the MTJ structure 22 may have a magnetization direction that is perpendicular to the tunnel or barrier layer 72, and thus a direction in which a current flows and an easy axis of magnetization may be substantially parallel to each other. As such, a structure having a perpendicular magnetization direction is referred to as a perpendicular MTJ structure.

The perpendicular MTJ structure 22 also includes a pinned layer 71, a tunnel or barrier layer 72, and a free layer 73. When a magnetization direction of the free layer 73 and a magnetization direction of the pinned layer 71 are parallel to each other, a resistance value is reduced, and when a magnetization direction of the free layer 73 and a magnetization direction of the pinned layer 71 are anti-parallel to each other, a resistance value may be increased. Accordingly, data may be stored in the perpendicular MTJ structure 22 according to a resistance value.

In order to form the MTJ structure 22 that is a perpendicular MTJ structure, each of the free layer 73 and the pinned layer 71 may be formed of a material having large magnetic anisotropy energy. Examples of the material having large magnetic anisotropy energy include an amorphous rare earth element alloy or a multilayer thin film such as (Co/Pt)n or (Fe/Pt)n. For example, each of the free layer 73 and the pinned layer 71 may be formed of an ordered alloy, and may include at least one of iron (Fe), cobalt (Co), nickel (Ni), palladium (Pa), and platinum (Pt). Alternatively, each of the free layer 73 and the pinned layer 71 may include at least one of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. The above alloys may be, for example, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$ in a chemical quantitative expression.

Figure 7A:
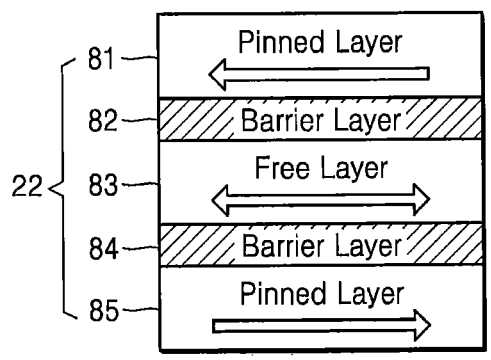

FIG. 7A illustrates a dual MTJ structure in which a tunnel or barrier layer and a pinned layer are disposed on both ends of a free layer. The MTJ structure 22 that is a planar dual MTJ structure may include a first pinned layer 81, a first tunnel or barrier layer 82, a free layer 83, a second tunnel or barrier layer 84, and a second pinned layer 85. A material of each of the first and second pinned layers 81 and 85 may be similar to that of the pinned layer 51 of FIG. 5A, a material of each of the first and second tunnel or barrier layers 82 and 84 may be similar to that of tunnel or barrier layer 52 of FIG. 5A, and a material of the free layer 83 may be similar to that of the free layer 53 of FIG. 5A.

When a magnetization direction of the first pinned layer 81 and a magnetization direction of the second pinned layer 85 are fixed to be opposite, magnetic forces of the first and second pinned layers 81 and 85 may be substantially offset. The MTJ structure 22 that is a planar dual MTJ structure may perform a read operation by using a current that is less than that of a typical MTJ element. Since the MTJ structure 22 provides a high resistance during a read operation due to the second tunnel or barrier layer 84, an accurate data value may be obtained.

Figure 7B:
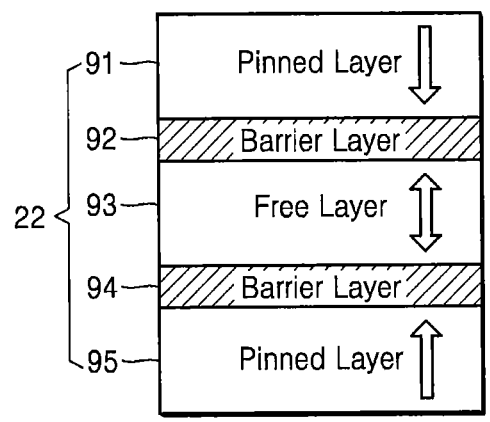

Referring to FIG. 7B, the MTJ structure 22 that is a perpendicular dual MTJ structure may include a first pinned layer 91, a first tunnel or barrier layer 92, a free layer 93, a second tunnel or barrier layer 94, and a second pinned layer 95. A material of each of the first and second pinned layers 91 and 95 may be similar to that of the pinned layer 71 of FIG. 6, a material of each of the first and second tunnel or barrier layers 92 and 94 may be similar to that of the tunnel or barrier layer 72 of FIG. 6, and a material of the free layer 93 may be similar to that of the free layer 73 of FIG. 6.

When a magnetization direction of the first pinned layer 91 and a magnetization direction of the second pinned layer 95 are fixed to be opposite, magnetic forces of the first and second pinned layers 91 and 95 may be substantially offset. The MTJ structure 22 that is a perpendicular dual MTJ structure may perform a read operation by using a current that is less than that of a typical MTJ element. Since the MTJ structure 22 provides a high resistance, an accurate data value may be obtained during a read operation.

The MTJ structure 22 of the main cell 20 (see FIG. 1) described with reference to FIGS. 3A through 7B may also apply to the reference cell 30 (see FIG. 1) of the reference cell array 114 (see FIG. 1). An MTJ structure of the reference cell 30 is a resistor element that is used to identify data of the main cell 20. In order to stably identify data of the main cell 20, the MTJ structure of the reference cell 30 can have a constant resistance value. However, a resistance value of the MTJ structure of the reference cell 30 may be changed due to a continuous read operation, and thus a resistance dispersion may be caused.

Figure 8A:
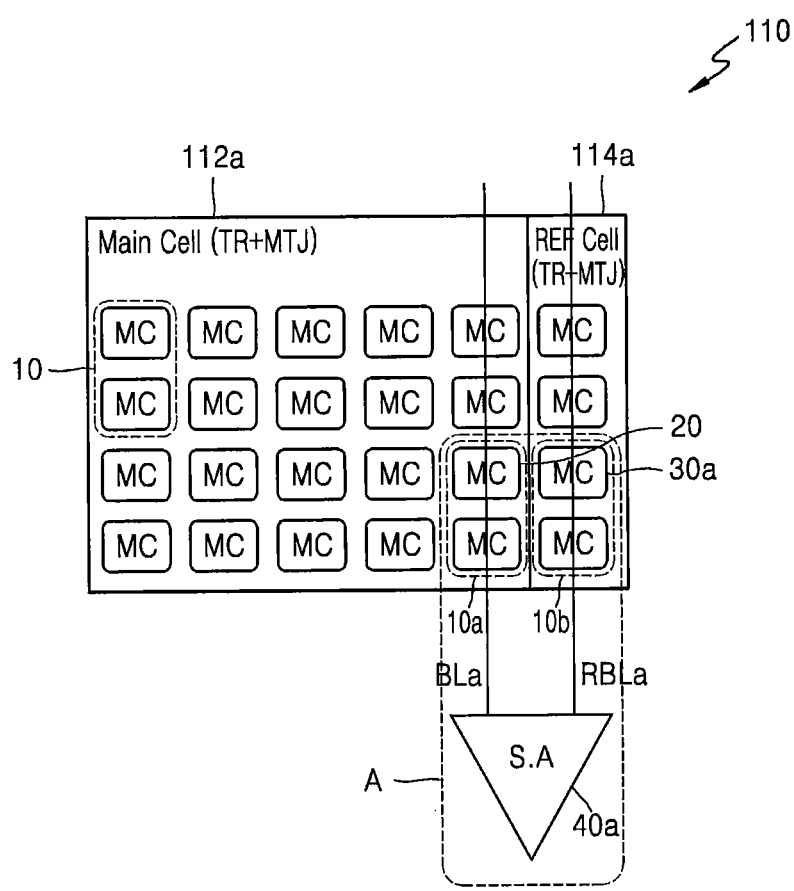
FIGS. 8A through 8C are diagrams illustrating a sensing margin of a main cell according to a resistance dispersion of an MTJ structure of a reference cell.
Figure 8B:
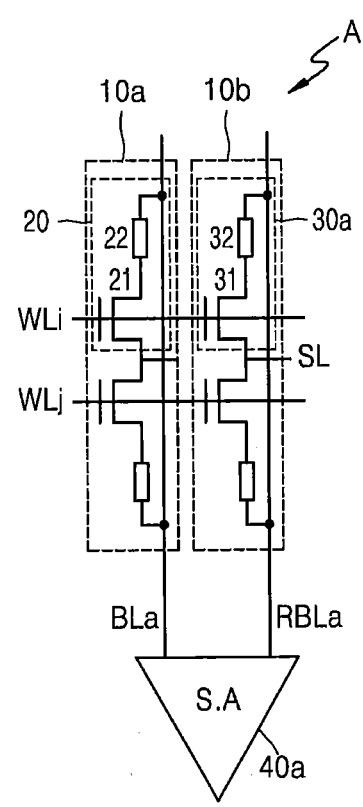
Figure 8C:
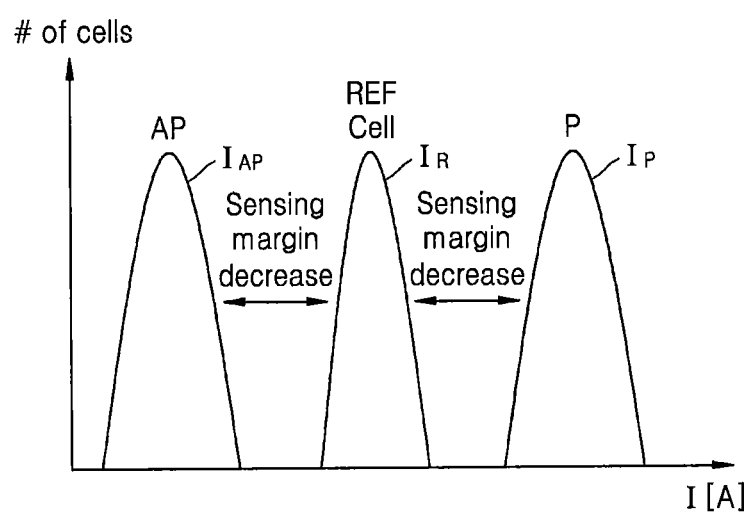

FIGS. 8A through 8C are diagrams illustrating a sensing margin of a main cell according to a resistance dispersion of an MTJ structure of a reference cell. FIG. 8A is a diagram illustrating a part of the memory cell array 110 of FIG. 1. FIG. 8B is a circuit diagram illustrating a first area A of the memory cell array 110. FIG. 8C is a graph illustrating a sensing margin according to a resistance dispersion of an MTJ structure of a reference cell.

Referring to FIG. 8A, in a part of the memory cell array 110, a main cell array 112a and a reference cell array 114a include memory cells that are STT-MRAM cells. A 2T-2R structure in which two memory cells MCs are commonly connected to one source line SL may constitute one unit memory cell 10 in terms of a layout.

According to an example embodiment, a 1T-1R structure in which one memory cell is connected to one bit line and one source line may constitute one unit memory cell 10 in terms of a layout.

A variable resistor element of an MTJ structure of the main cell 20 selected in the main cell array 112a is compared with a resistor element of an MTJ structure of a reference cell 30a selected in the reference cell array 114a. The bit line BL of the selected main cell 20 and the reference bit line RBL of the reference cell 30a are connected to a sense amplifier 40a. The sense amplifier 40a identifies data of the main cell 20 by detecting and amplifying a current flowing in the bit line BL of the main cell 20 and a current flowing in the reference bit line RBL of the reference cell 30a.

FIG. 8B is a circuit diagram illustrating the first area A of the memory cell array 110 of FIG. 8A in which a 2T-2R structure constitutes each of unit memory cells 10a and 10b. In the unit memory cell 10a of the main cell array 112a, two main cells 20 are commonly connected to one source line SL. The main cell 20 may include the cell transistor 21 and a variable resistor element of the MTJ structure 22. A gate of the cell transistor 21 is connected to a word line WLi, a drain of the cell transistor 21 is connected to one end of the MTJ structure 22, and a source of the cell transistor 21 is connected to the source line SL. The other end of the MTJ structure 22 is connected to the bit line BL. The main cell 20 may store a data '0' logic state when the MTJ structure 22 is in a P state and may store a data '1' logic state when the MTJ structure 22 is in an AP state.

In the unit memory cell 10b of the reference cell array 114a, two reference cells 30a are commonly connected to one source line SL. The reference cell 30a may include a cell transistor 31 and an MTJ structure 32, like the main cell 20. A gate of the cell transistor 31 is connected to the word line WLi, a drain of the cell transistor 31 is connected to one end of the MTJ structure 32, and a source of the cell transistor 31 is connected to the source line SL. The other end of the MTJ structure 32 is connected to the reference bit line RBL. The MTJ structure 32 of the reference cell 30a may be set to an intermediate resistance value between a P state and an AP state of the MTJ structure 22 of the main cell 20. A reference current flows in the reference bit line RBL of the selected reference cell 30a.

During a read operation of the main cell 20, a selection voltage of a logic high may be applied to the word line WLi, the cell transistor 21 of the main cell 20 and the cell transistor 31 of the reference cell 30a may be turned on, and a read current may be applied from a write/read bias generator to the bit line BL and the source line SL. Accordingly, a voltage is developed at both ends of the MTJ structure 22 of the main cell 20 and a current flows in the bit line BL.

The sense amplifier 40a determines a logic state stored in the MTJ structure 22 of the main cell 20 by comparing a current flowing in the bit line BL of the main cell 20 with a reference current $I_R$ flowing in the reference bit line RBL of the reference cell 30a. The sense amplifier 40a determines whether a current flowing in the bit line BL of the main cell 20 is an AP state current $I_{AP}$ or a P state current $I_P$ by comparing the current with the reference current $I_R$ flowing in the reference bit line RBL of the reference cell 30a as shown in FIG. 8C.

However, a resistance value of the MTJ structure 32 of the reference cell 30a may be changed due to a continuous read operation and a resistance dispersion of the MTJ structure 32 may be caused. When the reference current $I_R$ is widely distributed due to the resistance dispersion of the MTJ structure 32, a data sensing margin of the main cell 20 is reduced.

Various example embodiments in which in order to ensure a sufficient data sensing margin of the main cell 20, an MTJ structure of a reference cell is shorted and a reference resistor is provided to a reference bit line will now be explained in detail.

Figure 9:
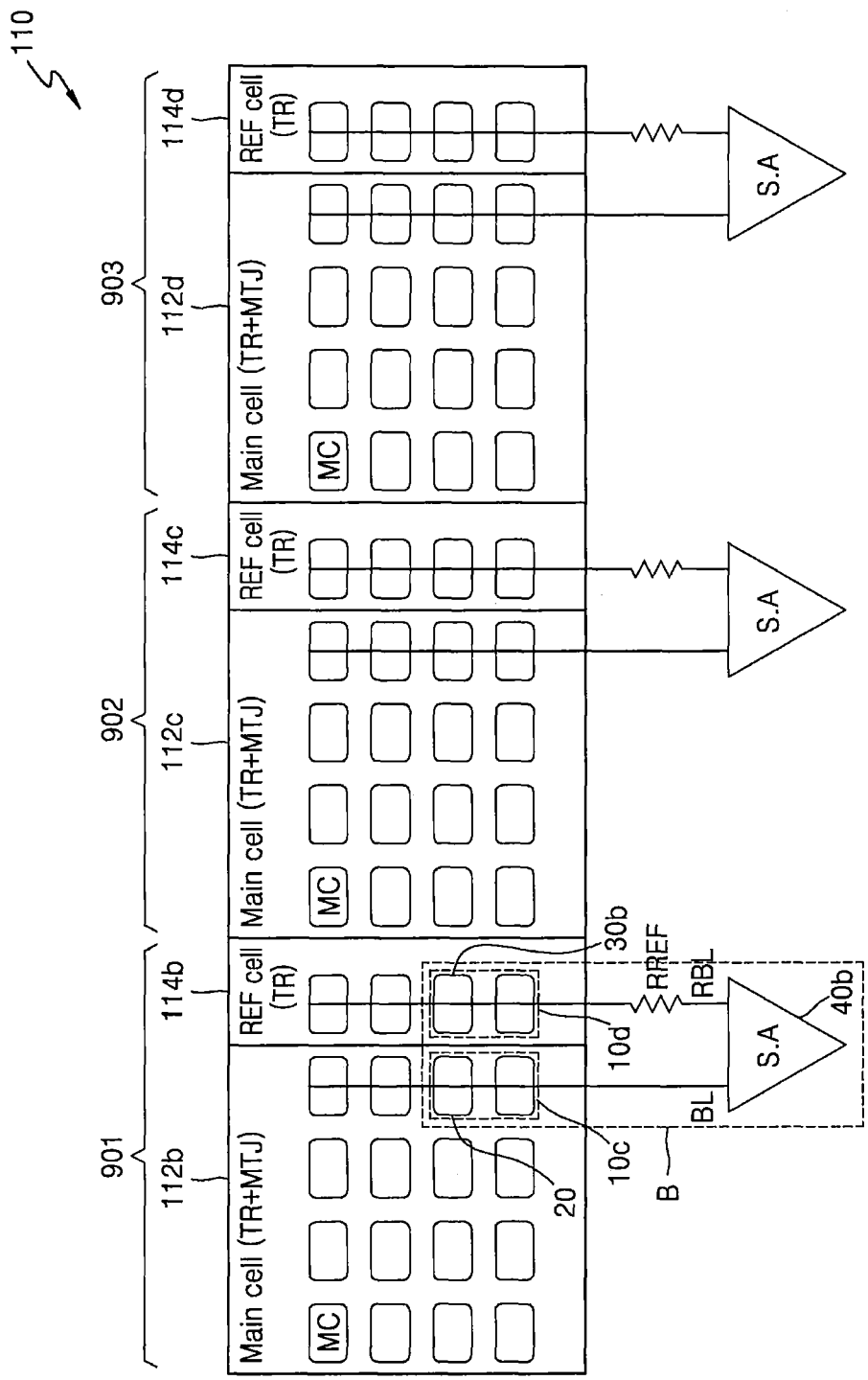
FIG. 9 is a diagram illustrating the memory cell array including a shorted variable resistor element of a memory cell according to example embodiments.

FIG. 9 is a diagram illustrating the memory cell array 110 including a shorted variable resistor element of a memory cell according to example embodiments.

Referring to FIG. 9, the memory cell array 110 includes a plurality of sub-array blocks, for example, first through third sub-array blocks 901, 902, and 903. The first through third sub-array blocks 901, 902, and 903 may constitute memory array tiles (MATs). The first through third sub-array blocks 901, 902, and 903 may be referred to as memory blocks to/from which, for example, 64-bit data is input/output. The first through third sub-array blocks 901, 902, and 903 respectively include first through third main cell arrays 112b, 112c, and 112d and first through third reference cell arrays 114b, 114c, and 114d. Although three sub-array blocks, that is, the first through third sub-array blocks 901, 902, and 903, are shown, the present example embodiment is not limited thereto and fewer or more sub-array blocks may be included.

In each of the first through third main cell arrays 112b, 112c, and 112d, like in the main cell array 112a of FIG. 8A, the main cells 20 that are STT-MRAM cells each including the cell transistor 21 and the MTJ structure 22 are arranged in rows and columns. A 2T-2R structure in which two main cells 20 are commonly connected to one source line SL constitutes the unit memory cell 10.

Each of the first through third reference cell arrays 114b, 114c, and 114d includes reference cells 30b that are arranged in rows and one column. In the reference cell 30b, unlike in the reference cell 30a of FIG. 8A, the MTJ structure 32 among the cell transistor 31 and the MTJ structure 32 is shorted.

In the first through third reference cell arrays 114b, 114c, and 114d, a reference resistor RREF that replaces the shorted MTJ structure 32 of the reference cell 30b is connected to the reference bit line RBL. The reference resistor RREF may be provided by the reference resistor control circuit unit 116 of FIG. 10.

The reference resistor RREF connected to the bit line BL of the main cell 20 selected in the first main cell array 112b and to the reference bit line RBL of the reference cell 30b selected in the first reference cell array 114b is connected to a sense amplifier 40b. The sense amplifier 40b identifies data of the selected main cell 20 by comparing a current flowing in the bit line BL with a current flowing in the reference bit line RBL.

Like in the first main cell array 112b, in the second and third main cell arrays 112c and 112d, reference resistors connected to bit lines of main cells selected in the second and third main cell arrays 112c and 112d and to reference bit lines of reference cells selected in the second and third reference cell arrays 114c and 114d are connected to the sense amplifier 40b, and data of the selected main cells are determined by comparing a current flowing in the bit lines with a current flowing in the reference bit lines.

Figure 10:
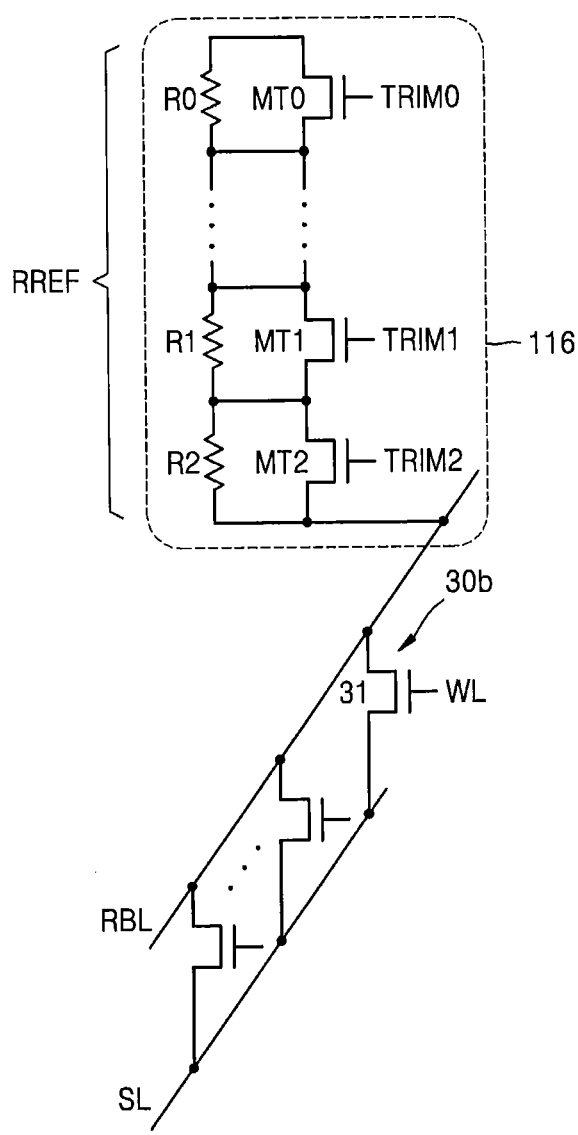
FIG. 10 is a circuit diagram of a reference resistor control circuit according to example embodiments.

FIG. 10 is a circuit diagram of the reference resistor control circuit 116 according to example embodiments.

Referring to FIG. 10, the reference resistor control circuit 116 includes a plurality of transistors, for example, first through third transistors MT0, MT1, and MT2, and a plurality of resistors, for example, first through third resistors R0, R1, and R2. The first through third resistors R0, R1, and R2 are connected in series to the reference bit line RBL and the first through third transistors MT0, MT1, and MT2 are respectively connected in parallel to the first through third resistors R0, R1, and R2. The first through third transistors MT0, MT1, and MT2 selectively short the first through third resistors R0, R1, and R2 in response to first through third trimming signals TRIM0, TRIM1, and TRIM2. According to an example embodiment, the reference resistor control circuit 116 may include a variety number of transistors and resistors, and may be controlled by a variety number of trimming control signals.

The reference resistor control circuit 116 generates the reference resistor RREF due to the first through third resistors R0, R1, and R2 that are selectively shorted in response to the first through third trimming signals TRIM0, TRIM1, and TRIM2. The first through third trimming signals TRIM0, TRIM1, and TRIM2 are provided during a test process of the semiconductor memory device 100 and are used so that the reference resistor RREF has a resistance value to replace the shorted MTJ structure 32 of the reference cell 30b. The reference resistor RREF generated by the reference resistor control circuit 116 may be connected to the reference bit line RBL and may be provided to the sense amplifier 40b.

Since the MTJ structure 32 of the reference cell 30b is shorted, the reference cell 30b may be referred to as including the cell transistor 31 that is connected between the reference bit line RBL and the source line SL. A gate of the cell transistor 31 of the reference cell 30b is connected to the word line WL.

Figure 11A:
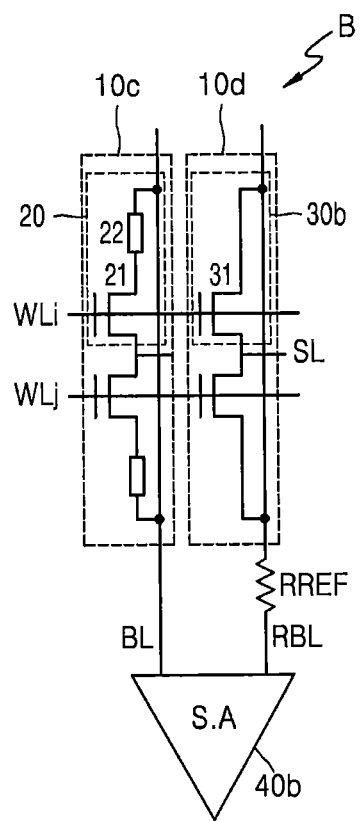
FIGS. 11A and 11B are diagrams illustrating a part of a first sub-array block of FIG. 9.
Figure 11B:
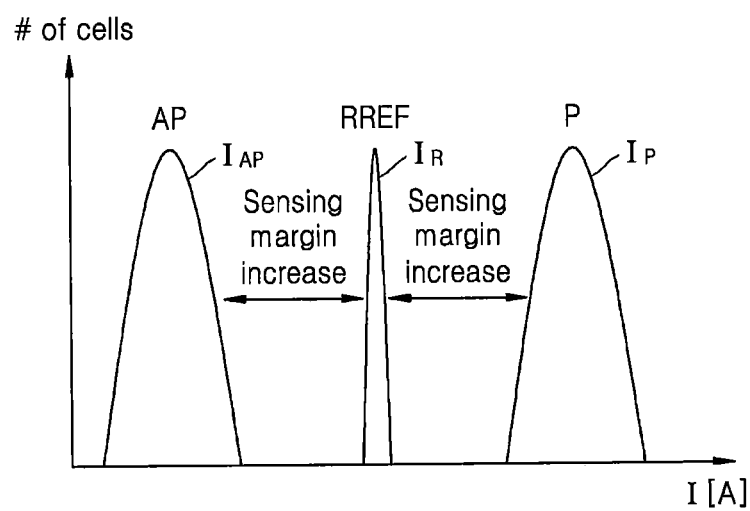

FIGS. 11A and 11B are diagrams illustrating a part of the first sub-array block 901 of FIG. 9. FIG. 11A is a circuit diagram illustrating a second area B of the first sub-array block 901 (see FIG. 9) in which a 2T-2R structure constitutes each of unit memory cells 10c and 10d. FIG. 11B is a graph illustrating a sensing margin of a main cell.

Referring to FIG. 11A, in the unit memory cell 10c of the first main cell array 112b (see FIG. 9) in the first sub-array block 901 (see FIG. 9), two main cells 20 are commonly connected to one source line SL. The main cell 20 may include the cell transistor 21 and the MTJ structure 22. A gate of the cell transistor 21 is connected to the word line WLi, a drain of the cell transistor 21 is connected to one end of the MTJ structure 22, and a source of the cell transistor 21 is connected to the source line SL. The other end of the MTJ structure 22 is connected to the bit line BL. The main cell 20 may store a data '0' logic state when the MTJ structure 22 is in a P state, and may store a data '1' logic state when the MTJ structure 22 is in an AP state.

In the unit memory cell 10d of the first reference cell array 114b, two reference cells 30b are commonly connected to one source line SL. In the reference cell 30b, a gate of the cell transistor 31 is connected to the word line WLi, a drain of the cell transistor 31 is connected to the reference bit line RBL, and a source of the cell transistor 31 is connected to the source line SL. The reference resistor RREF provided by the reference resistor control circuit 116 (see FIG. 10) is connected to the reference bit line RBL.

The bit line BL of the main cell 20 and the reference bit line RBL to which the reference resistor RREF is connected are connected to the sense amplifier 40b. The sense amplifier 40b identifies a logic state stored in the MTJ structure 22 of the main cell 20 by comparing a current flowing in the bit line BL with a reference current $I_R$ flowing in the reference bit line RBL.

Since the resistance value of reference resistor RREF is constant or fixed (e.g., non-variable), the reference current $I_R$ flowing in the reference bit line RBL has a narrow dispersion as shown in FIG. 11B. Accordingly, when the sense amplifier 40b determines whether a current flowing in the bit line BL of the main cell 20 is an AP-state current $I_{AP}$ or a P-state current $I_P$ based on the reference current $I_R$ flowing in the reference bit line RBL, a sensing margin is increased. That is, reference resistor RREF has a narrower resistance dispersion or range than that of the MTJ structure 22 in either of the logic states.

Figure 12:
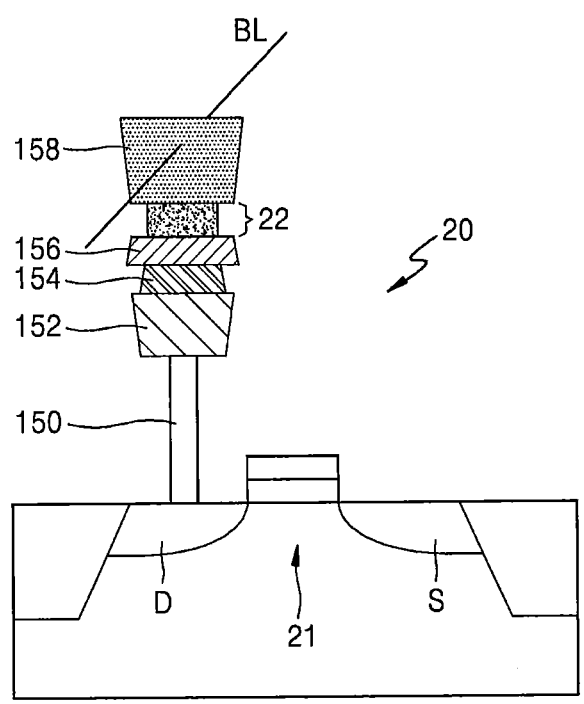
FIG. 12 is a cross-sectional view illustrating a structure of a main cell according to example embodiments.

FIG. 12 is a cross-sectional view illustrating a structure of the main cell 20 according to example embodiments.

Referring to FIG. 12, the MTJ structure 22 of the main cell 20 is connected to a drain region D of the cell transistor 21 formed under the MTJ structure 22. The drain region D of the cell transistor 21 is electrically connected to a pad electrode 152 through a first contact plug 150. A second contact plug 154 is formed on the pad electrode 152 and a lower electrode 156 and the MTJ structure 22 are formed on the second contact plug 154. The MTJ structure 22 may be formed to have any of various structures of FIGS. 3 through 7. An upper electrode 158 is formed on the MTJ structure 22, the bit line BL is formed on the upper electrode 158, and the bit line BL is electrically connected to the MTJ structure 22 through the upper electrode 158.

Figure 13:
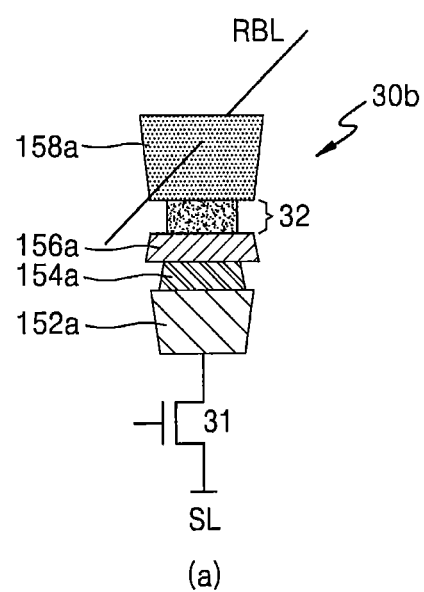
FIGS. 13 through 17 are views of a shorted MTJ structure of a reference cell according to example embodiments.
Figure 13:
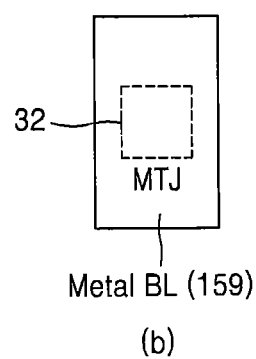
Figure 14:
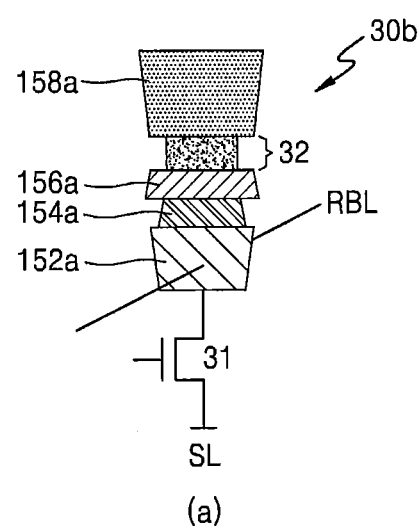
Figure 14:
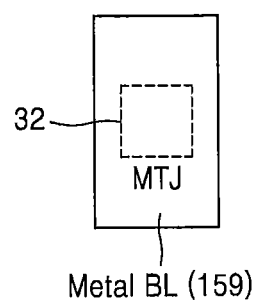
Figure 15:
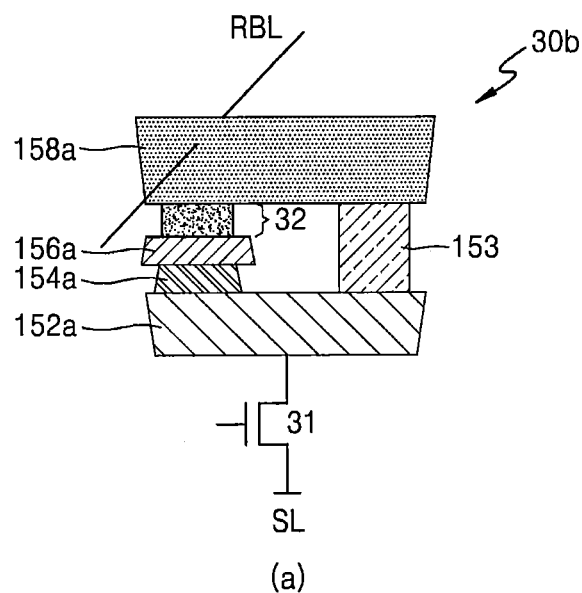
Figure 15:
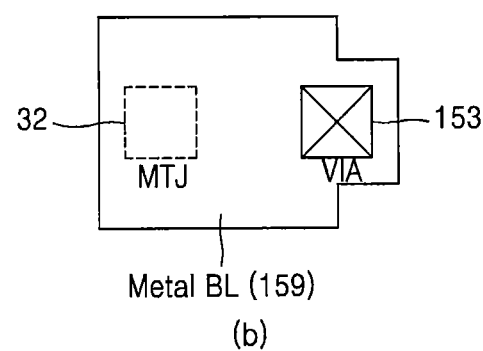
Figure 16:
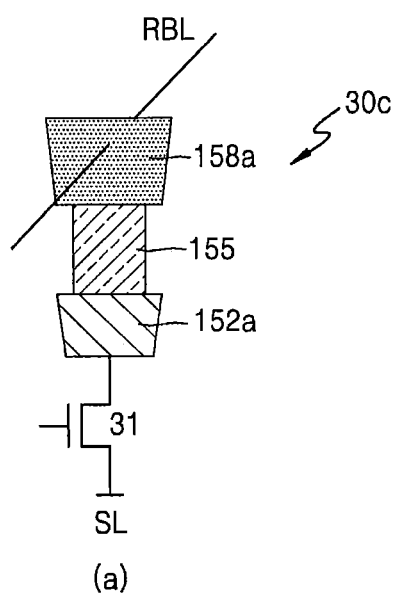
Figure 16:
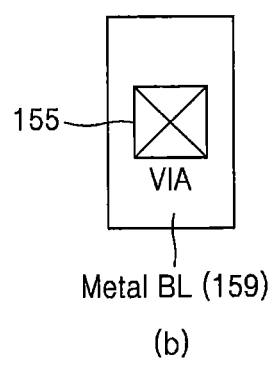

FIGS. 13 through 17 are views of an MTJ structure of a reference cell according to example embodiments. FIGS. 13 through 15 are views illustrating that the MTJ structure 32 of the reference cell 30b that is the same as the MTJ structure 22 of the main cell 20 of FIG. 12 is shorted. FIG. 16 is a view illustrating that an MTJ structure of the reference cell 30c that is different from the MTJ structure 22 of the main cell 20 of FIG. 12 is replaced with a via hole and is omitted.

Referring to FIG. 13, the MTJ structure 32 that is a part of the reference cell 30b is formed to be the same as or similar to the MTJ structure 22 of the main cell 20. In the MTJ structure 32 of the reference cell 30b, a second contact plug 154a is formed on a pad electrode 152a that is a connection node between the cell transistor 31 and the MTJ structure 32 and a lower electrode 156a and the MTJ structure 32 are formed on the second contact plug 154a. An upper electrode 158a is formed on the MTJ structure 32, the reference bit line RBL is formed on the upper electrode 158a, and the reference bit line RBL is electrically connected to the MTJ structure 32 through the upper electrode 158a.

The MTJ structure 32 of the reference cell 30b shorts a tunnel or barrier layer formed of an insulating metal oxide by using a breakdown voltage. In this case, in a layout of the reference cell 30b, a layout pattern of the MTJ structure 32 of the reference cell 30b is disposed in (i.e., confined within at least one dimension of) a metal bit line pattern 159.

Referring to FIG. 14, the reference bit line RBL of the reference cell 30b is electrically connected to the pad electrode 152a. Accordingly, the MTJ structure 32 of the reference cell 30b becomes an element that is not used by the reference bit line RBL. In this case, in a layout of the reference cell 30b, a layout pattern of the MTJ structure 32 of the reference cell 30b is disposed in the metal bit line pattern 159.

Referring to FIG. 15, the MTJ structure 32 of the reference cell 30b is electrically connected (e.g., in parallel) to a conductive via element in a via hole 153 that is formed between the reference bit line RBL and the pad electrode 152a. The via hole 153 is filled with a conductive material to define the conductive via element. The MTJ structure 32 of the reference cell 30b is electrically shorted due to the via hole 153. In this case, in a layout of the reference cell 30b, layout patterns of the via hole 153 and the MTJ structure 32 of the reference cell 30b are disposed in the metal bit line pattern 159.

Referring to FIG. 16, the MTJ structure of the reference cell 30c that is to be formed on the pad electrode 152a is replaced with a via hole 155 that is filled with a conductive material to define a conductive via element. That is, the MTJ structure of the reference cell 30c is omitted. In this case, in a layout of the reference cell 30c, a layout pattern of the via hole 155 is disposed in the metal bit line pattern 159.

Figure 17:
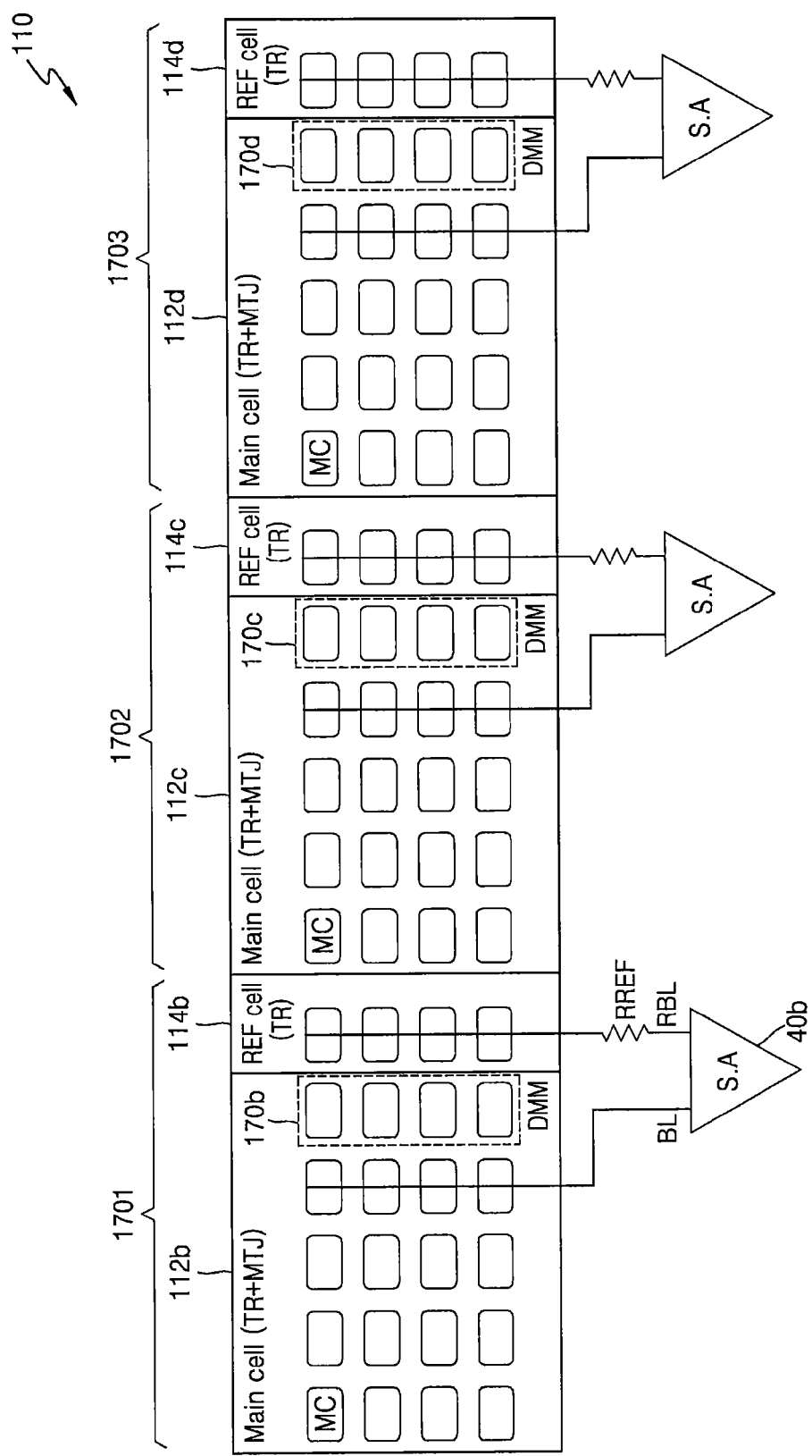

Since the reference cell 30b of FIGS. 13 through 15 is formed to be the same as the main cell 20 (see FIG. 12), a process variation does not occur between the first through third main cell arrays 112b, 112c, and 112d and the first through third reference cell arrays 114b, 114c, and 114d in the sub-array blocks 901, 902, and 903 of FIG. 9. In contrast, in the reference cell 30c of FIG. 16, since a process variation occurs between the first through third main cell arrays 112b, 112c, and 112d and the first through third reference cell arrays 114b, 114c, and 114d, dummy cell blocks 170b, 170c, and 170d for overcoming a process variation are necessary as shown in FIG. 17.

Figure 18:
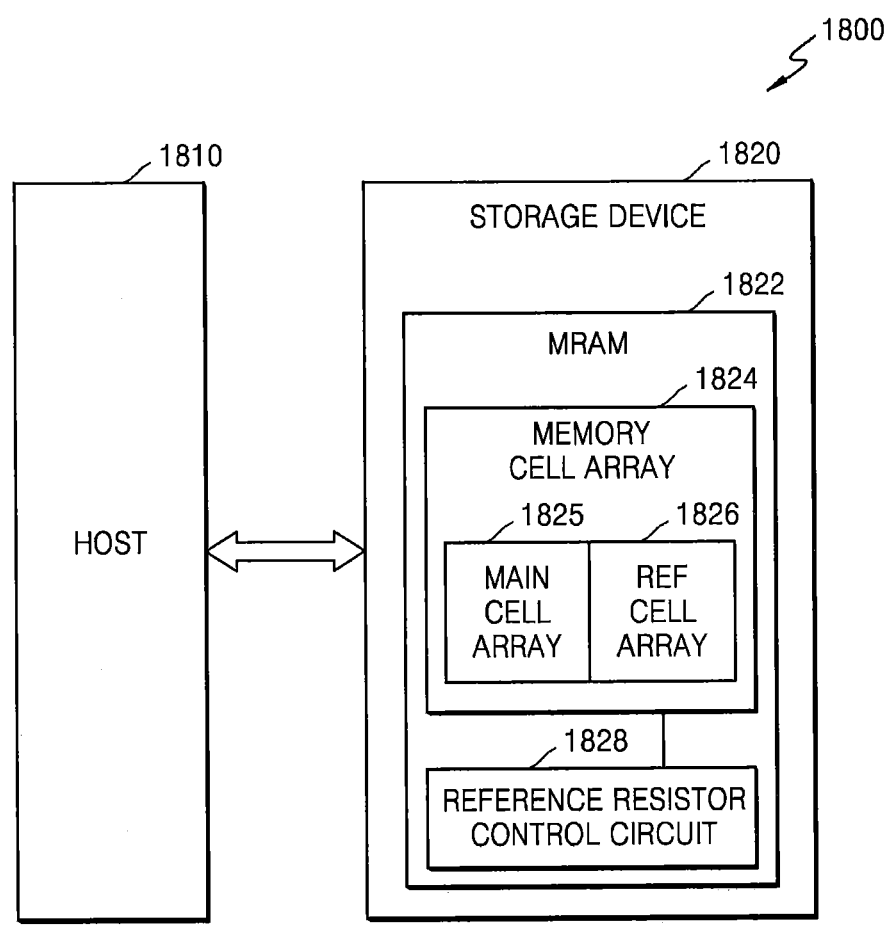
FIG. 18 is a block diagram of an electronic device including a memory device including a shorted variable resistor element of a memory cell according to example embodiments.

FIG. 18 is a block diagram of an electronic apparatus 1800 including a memory device including a shorted variable resistor element of a memory cell according to example embodiments.

Referring to FIG. 18, the electronic apparatus 1800 includes a host 1810 and a storage device 1820. The host 1810 may include a user device such as a personal/portable computer, a tablet PC, a personal digital assistant (PDA), a portable media player (PMP), a digital camera, or a camcorder. The host 1810 stores data in or read data from the storage device 1820 through an input/output request.

The host 1810 may be connected to the storage device 1820 through any of various interfaces such as a universal serial bus (USB), a multimedia card (MMC), a peripheral component interconnection (PCI), a PCI-express (PCI-E), an advanced technology attachment (ATA), a serial-ATA, a parallel-ATA, a small computer small interface (SCSI), an enhanced small disk interface (ESDI), or an integrated drive electronics (IDE).

The storage device 1820 that is a data storage unit for performing a write operation or a read operation according to an input/output request of the host 1810 may include a resistive memory device 1822. The resistive memory device 1822 includes a memory cell array 1824 and a reference resistor control circuit 1828, and the memory cell array 1824 includes a main cell array 1825 and a reference cell array 1826.

Main cells each including a first cell transistor and a first variable resistor element are arranged in the main cell array 1825, and bit lines of the main cells are provided to a sense amplifier. Reference cells each including a second cell transistor and a shorted second variable resistor element are arranged in the reference cell array 1826, and a reference bit line of the reference cell is provided to the sense amplifier. The second variable resistor element of the reference cell may be shorted by using a breakdown voltage of an MTJ element, or by connection in parallel to conductive via element defined by a via hole in which a conductive material is filled, or by connection of the reference bit line to a connection node between the second variable resistor element and the second cell transistor, or by replacement of the second variable resistor element with the conductive via element defined by the via hole in which the conductive material is filled.

The reference resistor control circuit 1828 generates a reference resistor instead of the shorted second variable resistor element of the reference cell, and provides the reference resistor to the reference bit line. The sense amplifier increases a sensing margin of the main cell by detecting and amplifying a current flowing in the bit line of the main cell and a current flowing in the reference bit line of the reference cell to which the reference resistor is connected.

Figure 19:
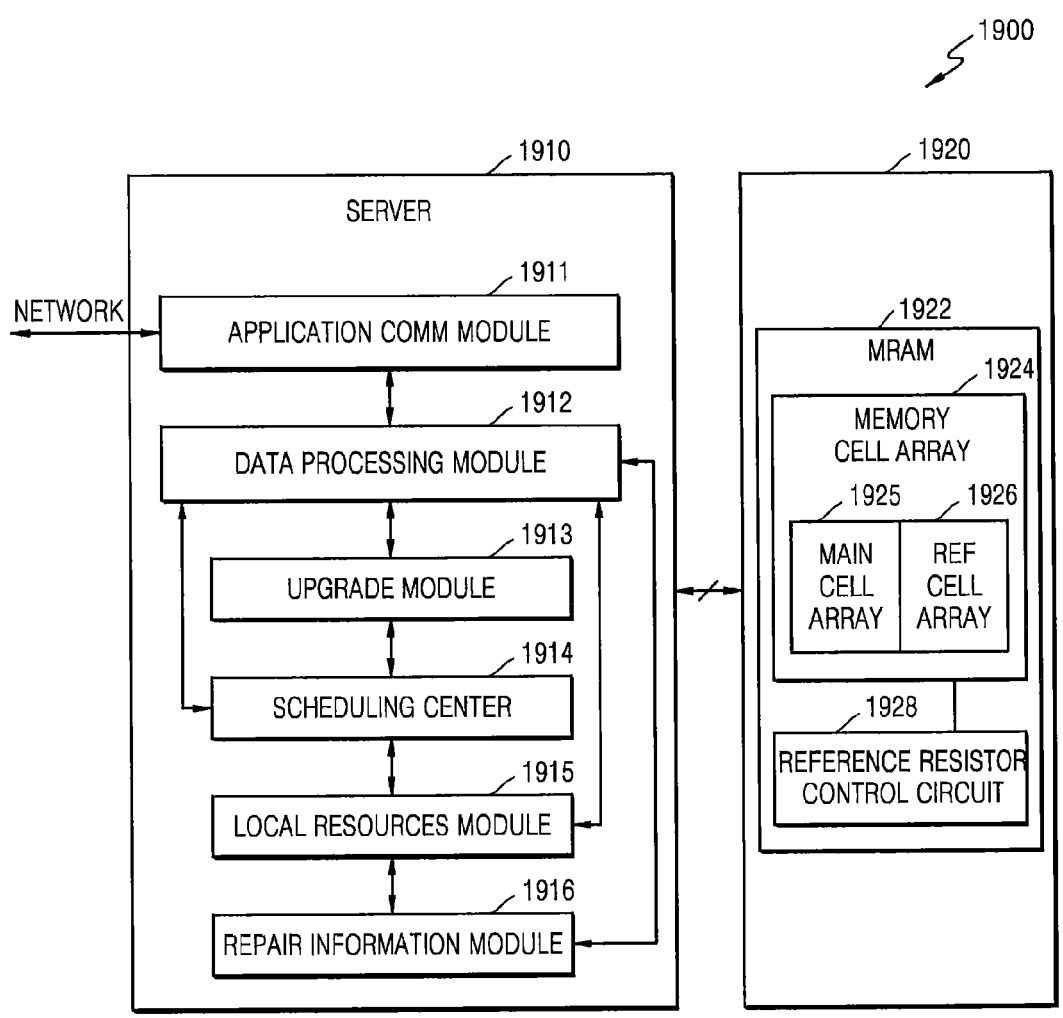
FIG. 19 is a block diagram of a server system including a memory device including a shorted variable resistor element of a memory cell according to example embodiments.

FIG. 19 is a block diagram of a server system 1900 including a memory device including a shorted variable resistor element of a memory cell according to example embodiments.

Referring to FIG. 19, the server system 1900 includes a server 1910 and at least one storage device 1920 that stores data necessary to operate the server 1910. The server 1910 includes an application communication module 1911, a data processing module 1912, an upgrade module 1913, a scheduling center 1914, a local resources module 1915, and a repair information module 1916. The application communication module 1911 communicates with a computing system connected to the server 1910 through a network or enables the server 1910 and the storage device 1920 to communicate with each other. The application communication module 1911 transmits data or information provided through a user interface to the data processing module 1912.

The data processing module 1912 is linked to the local resources module 1915. The local resources module 1915 provides a list of repair shops/dealers/technical information based on data or information input to the server 1910. The upgrade module 1913 interfaces with the data processing module 1912. The upgrade module 1913 upgrades firmware, reset code, diagnosis system upgrade information, or other information to an electronic appliance based on data or information transmitted from the storage device 1920.

The scheduling center 1914 allows a user to make an option in real time based on data or information input to the server 1910. The repair information module 1916 interfaces with the data processing module 1912. The repair information module 1916 is used to provide repair-related information such as an audio, a video, or a document file to the user. The data processing module 1912 packages related information based on information transmitted from the storage device 1920. Next, the information is transmitted to the storage device 1920 or displayed to the user. The storage device 1920 may include a resistive memory device 1922 that is a data storage unit.

The resistive memory device 1922 includes a memory cell array 1924 and a reference resistor control circuit 1928, and the memory cell array 1924 includes a main cell array 1925 and a reference cell array 1926.

Main cells each including a first cell transistor and a first variable resistor element are arranged in the main cell array 1925, and bit lines of the main cells are provided to a sense amplifier. Reference cells each including a second cell transistor and a shorted second variable resistor element are arranged in the reference cell array 1926, and a reference bit line of the reference cell is provided to the sense amplifier. The second variable resistor element of the reference cell may be shorted by using a breakdown voltage of an MTJ structure, or may be connected in parallel to a conductive via element defined by via hole in which a conductive material is filled, or the reference bit line may be connected to a connection node between the second cell transistor and the second variable resistor element, or the second variable resistor element may be replaced with the conductive via element defined by the via hole in which the conductive material is filled.

The reference resistor control circuit 1928 generates a reference resistor instead of the shorted second variable resistor element of the reference cell and provides the reference resistor to the reference bit line. The sense amplifier increases a sensing margin of the main cell by detecting and amplifying a current flowing in the bit line of the main cell and a current flowing in the reference bit line of the reference cell to which the reference resistor is connected.

While the inventive concepts have been particularly shown and described with reference to example embodiments thereof, it will be understood that various changes in form and details may be made therein without departing from the spirit and scope of the following claims.

What is claimed is:

1. A semiconductor memory device comprising:
   a plurality of resistive memory cells arranged in rows and columns, each of the plurality of resistive memory cells comprising a cell transistor and a variable resistor element;
   a first memory cell array comprising a first cell transistor connected to one of a plurality of word lines respectively corresponding to the rows and a first variable resistor element connected to one of a plurality of first bit lines respectively corresponding to the columns;
   a second memory cell array comprising a second cell transistor connected to one of the plurality of word lines and a second variable resistor element connected to a second bit line corresponding to one of the columns, wherein the second variable resistor element is shorted; and
   a reference resistor connected to the second bit line.

2. The semiconductor memory device of claim 1, further comprising a sense amplifier connected to the one of the plurality of first bit lines and the second bit line.

3. The semiconductor memory device of claim 1, wherein the second variable resistor element comprises a magnetic tunnel junction (MTJ) element,
   wherein the MTJ element is shorted based on a breakdown voltage.

4. The semiconductor memory device of claim 1, wherein the second variable resistor element is connected in parallel with a conductive via element comprising a conductive material in a via hole.

5. The semiconductor memory device of claim 1, wherein the reference resistor is included in a reference resistor control circuit,
   wherein the reference resistor control circuit comprises:
   a plurality of resistors; and
   transistors respectively connected in parallel to the plurality of resistors,
   wherein the transistors are configured to selectively short the plurality of resistors in response to trimming signals.

6. The semiconductor memory device of claim 5, wherein the trimming signals are applied during a process of testing the semiconductor memory device.

7. The semiconductor memory device of claim 1, wherein the resistive memory cells comprise at least one of spin-transfer torque-magnetoresistive random-access memory (STT-MRAM) cells, magnetoresistive random-access memory (MRAM) cells, phase change random-access memory (PRAM) cells, and resistive random-access memory (ReRAM) cells.

8. A semiconductor memory device comprising:
   a plurality of resistive memory cells arranged in rows and columns, each of the plurality of resistive memory cells comprising a cell transistor and a variable resistor element;
   a first memory cell array comprising a first cell transistor connected to one of a plurality of word lines respectively corresponding to the rows and a first variable resistor element connected to one of a plurality of first bit lines respectively corresponding to the columns;
   a second memory cell array comprising a second cell transistor connected to one of the plurality of word lines and a second variable resistor element connected to a second bit line corresponding to one of the columns, wherein the second bit line is connected to a connection node between the second cell transistor and the second variable resistor element; and
   a reference resistor connected to the second bit line.

9. The semiconductor memory device of claim 8, further comprising a sense amplifier connected to the one of the plurality of first bit lines and the second bit line.

10. The semiconductor memory device of claim 8, wherein the connection node is a pad electrode connected to a drain of the second cell transistor and the second variable resistor element.

11. The semiconductor memory device of claim 8, wherein the reference resistor has an intermediate resistance value that is between resistance values corresponding to a first data logic and a second data logic stored in the first variable resistor element.

12. A semiconductor memory device comprising:
   a main memory cell array comprising first resistive memory cells, the first resistive memory cells respectively comprising a first cell transistor and a first variable resistor element connected between the first cell transistor and a first bit line;
   a reference memory cell array comprising second resistive memory cells, the second resistive memory cells respectively comprising a second cell transistor and a second variable resistor element connected between the second cell transistor and a second bit line, wherein the second variable resistor element comprises an electrical short; and
   a reference resistor circuit comprising at least one reference resistor coupled to the second bit line.

13. The semiconductor memory device of claim 12, further comprising:
   a sense amplifier coupled to the first and second bit lines and configured to detect and amplify respective currents flowing therein,
   wherein a resistance value of the at least one reference resistor coupled to the second bit line is between resistance values corresponding to first and second logic states of the first variable resistor element.

14. The semiconductor memory device of claim 13, wherein the resistance value of the at least one reference resistor comprises a narrower range than the resistance values corresponding to first and second logic states of the first variable resistor element.

15. The semiconductor memory device of claim 13, wherein the at least one reference resistor has a fixed resistance.

16. The semiconductor memory device of claim 15, wherein the at least one reference resistor comprises a plurality of resistors having respective fixed resistances, and wherein the reference resistor circuit comprises:

a plurality of transistors, the transistors connected in parallel to the resistors, respectively, wherein the transistors are configured to selectively short the resistors in response to respective trimming signals to provide the resistance value that is between the resistance values corresponding to the first and second logic states of the first variable resistor element.

17. The semiconductor memory device of claim 12, wherein the second variable resistor element comprises a magnetic tunnel junction (MTJ) element having a breakdown voltage associated therewith, and wherein the electrical short is provided by the MTJ element responsive to application of a voltage greater than the breakdown voltage thereto.

18. The semiconductor memory device of claim 12, wherein the electrical short comprises a conductive via element that extends through a via hole and is electrically connected in parallel with the second variable resistor element.

19. The semiconductor memory device of claim 12, wherein the electrical short comprises a connection of the second bit line to a connection node between the second cell transistor and the second variable resistor element.

20. The semiconductor memory device of claim 12, wherein the second variable resistor element comprises a conductive via element that extends through a via hole to provide the electrical short.

* * * * *